United States Patent
Violette et al.

(10) Patent No.: US 6,475,850 B2
(45) Date of Patent: *Nov. 5, 2002

(54) BIPOLAR-CMOS (BICMOS) PROCESS FOR FABRICATING INTEGRATED CIRCUITS

(75) Inventors: Michael Violette; Martin Ceredig Roberts, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/873,808

(22) Filed: Jun. 4, 2001

(65) Prior Publication Data

US 2001/0031525 A1 Oct. 18, 2001

Related U.S. Application Data

(63) Continuation of application No. 08/585,453, filed on Jan. 16, 1996, now Pat. No. 6,245,604.

(51) Int. Cl.[7] .......................................... H01L 21/8238
(52) U.S. Cl. ...................................... 438/203; 438/202
(58) Field of Search ................................. 438/202, 203, 438/FOR 219, FOR 322, FOR 351, FOR 353, FOR 216, FOR 217, FOR 218

(56) References Cited

U.S. PATENT DOCUMENTS

| | | | |
|---|---|---|---|
| 4,345,366 A | 8/1982 | Brower | 29/571 |
| 4,694,562 A | 9/1987 | Iwasaki et al. | 437/57 |
| 4,737,472 A | 4/1988 | Schaber et al. | 437/59 |
| 4,764,482 A | 8/1988 | Hsu | 437/57 |
| 4,818,720 A | 4/1989 | Iwasaki | 437/58 |
| 4,847,213 A | 7/1989 | Pfiester | 437/24 |
| 4,857,478 A | 8/1989 | Niwano et al. | 437/61 |
| 4,902,640 A | 2/1990 | Sachitano et al. | 437/57 |
| 4,960,726 A | 10/1990 | Lechaton et al. | 437/59 |
| 4,987,089 A | 1/1991 | Roberts | 437/34 |
| 5,045,493 A | 9/1991 | Kameyama et al. | 437/59 |
| 5,059,549 A | 10/1991 | Furuhatta | 437/59 |
| 5,132,234 A | 7/1992 | Kim et al. | 437/31 |
| 5,158,463 A | 10/1992 | Kim et al. | 437/34 |
| 5,192,992 A | 3/1993 | Kim et al. | 257/370 |
| 5,196,356 A | 3/1993 | Won et al. | 437/31 |
| 5,208,169 A | 5/1993 | Shah et al. | 437/31 |
| 5,286,991 A | 2/1994 | Hui et al. | 257/306 |
| 5,354,699 A | 10/1994 | Ikeda et al. | 437/34 |
| 5,358,884 A | 10/1994 | Violette | 437/341 |
| 5,439,833 A | 8/1995 | Hebert et al. | 437/31 |
| 5,455,444 A | 10/1995 | Hsue | 257/413 |
| 5,494,844 A | 2/1996 | Suzuki | 437/59 |
| 5,525,530 A | 6/1996 | Watabe | 437/34 |
| 6,245,604 B1 * | 6/2001 | Violette et al. | 438/202 |

FOREIGN PATENT DOCUMENTS

| | | | | |
|---|---|---|---|---|
| JP | 61-139057 | 6/1986 | | H01L/27/06 |
| JP | 3-116774 | 5/1991 | | H01L/27/06 |
| JP | 4-92416 | 3/1992 | | H01L/21/28 |
| JP | 4-230023 | 8/1992 | | H01L/21/265 |

* cited by examiner

*Primary Examiner*—Long Pham
(74) *Attorney, Agent, or Firm*—Schwegman, Lundberg, Woessner & Kluth, P.A.

(57) ABSTRACT

A BiCMOS integrated circuit is fabricated using a minimum number of wafer processing steps and yet offers the IC circuit designer five (5) different transistor types. These types include P-channel and N-channel MOS transistors and three different bipolar transistors whose emitters are all formed by a different process and all are characterized by different current gains and different breakdown voltages. A differential silicon dioxide/silicon nitride masking technique is used in the IC fabrication process wherein both P-type buried layers (PBL) and N-type buried layers (NBL) are formed in a silicon substrate using a single mask set and further wherein P-type wells and N-type wells are formed above these buried layers in an epitaxial layer, also using a single $SiO_2/Si_3N_4$ differential mask set. Two of the bipolar transistor emitters are formed by out diffusion from first and second levels of polysilicon, whereas the emitter of the third bipolar transistor is formed by ion implantation doping.

32 Claims, 4 Drawing Sheets

BIPOLAR-CMOS (BICMOS) PROCESS FOR FABRICATING INTEGRATED CIRCUITS

CROSS REFERENCE TO RELATED APPLICATIONS

This application is a continuation of U.S. patent application Ser. No. 08/585,453, filed on Jan. 16, 1996, now U.S. Pat. No. 6,245,604 the specification of which is incorporated herein by reference. This application is also related to U.S. patent application Ser. No. 09/140,497, filed on Aug. 27, 1998, now issued as U.S. Pat. No. 6,043,541.

TECHNICAL FIELD

The present invention relates generally to the fabrication of integrated circuits containing both bipolar transistors and complementary metal-oxide-silicon (CMOS) transistors in a silicon wafer. More particularly, the present invention is directed to such a fabrication process wherein multiple bipolar transistors having different current gains and voltage breakdowns are produced by out-diffusing impurities from surface conductors of the integrated circuit into the silicon wafer to form the transistor emitters.

BACKGROUND ART

In the fabrication of static random access memories (SRAMs) as well as various other types of integrated circuits, it is known construct both P-channel and N-channel MOS transistors in a silicon wafer and to electrically isolate these transistors by the use of N-wells and P-wells, respectively. CMOS integrated circuits offer a more powerful circuit operation than either N-channel or P-channel circuits alone. This factor, combined with the lower power consumption and increased speed, has made CMOS the favored technology for the manufacture of microprocessors and memory devices. It is also well known to construct bipolar transistors in these integrated circuits in order to provide added circuit flexibility and current drive capability to these integrated circuits.

Earlier processes used for manufacturing these BiCMOS integrated circuits utilized separate and dedicated photoresist masking steps to form CMOS transistors on the one hand and the bipolar transistors on the other hand in order to provide the necessary processing isolation required in defining, doping, and making electrical connections to these different types of transistors. Typically, the areas of the silicon wafer in which the CMOS transistors were formed were subjected to a specific series of photolithographic masking and etching steps using photoresist masks to implant and then drive in dopant impurities into the CMOS transistor regions. Another completely different series of photolithographic masking and etching steps were then used for masking the area of the silicon wafer in which the bipolar transistor regions were formed using ion implantation and drive in diffusion processes well known in the art.

In order to reduce the number of processing steps required in the above prior art BiCMOS process, there has been developed a new and improved BiCMOS process wherein the bipolar transistors formed in the silicon wafer do not require dedicated photoresist masking and etching processes. This feature in turn thereby significantly reduces the total number of individual process steps and reticles required in the overall integrated circuit process flow. This new and improved process is disclosed and claimed in U.S. Pat. No. 4,987,089 issued to Ceredig Roberts, assigned to the present assignee and incorporated herein by reference.

SUMMARY OF INVENTION

The general purpose and principal object of the present invention is to provide still further new and useful improvements in the art of BiCMOS circuit fabrication and with respect to the novel process of U.S. Pat. No. 4,987,089. These improvements as disclosed and claimed herein serve to even further reduce the number of process steps and reticles required in the BiCMOS SRAM process flow for manufacturing these integrated circuits.

Another object of this invention is to provide a new and improved BiCMOS process of the type described which produces a maximum number of different transistor types, both MOS and bipolar, using the minimum number of individual integrated circuit fabrication steps.

Another object of this invention is to provide a new and improved BiCMOS process of the type described which operates to reduce manufacturing costs and enhance process yields.

Another object of this invention is to provide a new and improved BiCMOS process of the type described which operates to increase integrated circuit packing density.

Another object of this invention is to provide a new and improved BiCMOS process of the type described which is characterized by increased circuit design flexibility by offering three different bipolar transistor types having different gains and different voltage breakdown characteristics.

Another object of this invention is to provide a new and improved BiCMOS integrated circuit having improved bipolar transistor emitter connections.

A novel feature of this invention is the provision of a BiCMOS integrated circuit fabricated using a minimum number of wafer processing steps and yet offering the IC circuit designer five (5) different transistor types. These types include P-channel and N-channel MOS transistors and three different bipolar transistors whose emitters are all formed by a different process and each of which is characterized by a different current gain and a different breakdown voltage.

Another feature of this invention is the provision of a differential silicon dioxide/silicon nitride masking process wherein both P-type buried layers (PBL) and N-type buried layers (NBL) are formed in a silicon substrate using a single mask set and further wherein the P-type wells and the N-type wells are formed above these buried layers in an epitaxial layer, also using a single $SiO_2/Si_3N_4$ differential mask set.

To achieve the above purpose, objects, and novel features, the present BiCMOS integrated circuit fabrication process includes the steps of: forming first and second levels of polycrystalline silicon (polysilicon) on the surface of a silicon substrate and utilizing the first polysilicon level to electrically connect to an MOS transistor within the substrate (epitaxial layer) forming a bipolar transistor base region in the substrate; connecting the second level of polysilicon to the transistor base region; and out-diffusing impurities from the second level of polysilicon into the base region to thereby form the bipolar transistor emitter region, whereby separate ion implantation and drive-in diffusion steps to form the emitter region are eliminated.

In accordance with a preferred BiCMOS integrated circuit embodiment of the invention as a free-standing article of commerce and commensurate in scope with the broad article claims filed herein, there is provided a BiCMOS integrated circuit of the type having a first level of polysilicon connected to an MOS transistor in one region of a silicon substrate and a bipolar transistor formed in another region of the substrate. This embodiment is characterized in that the bipolar transistor emitter region is formed by connecting a second level of polysilicon to the bipolar transistor base region and out-diffusing impurities from second level of polysilicon to thereby convert the conductivity of the base region and form the transistor emitter region.

In accordance with the more specific process and device claims according to the present invention, there is provided a new and improved BiCMOS integrated circuit wherein initially N-type and P-type buried layers are formed in a silicon substrate and thereafter an epitaxial layer is formed on the surface of these N-type and P-type buried layers. Then, N-type and P-type wells are formed in the epitaxial layer using conventional CMOS processing technology. Net, the P-channel and N-channel MOS transistors are formed in adjacent N-wells and P-wells utilizing a first level of polysilicon as the MOS transistor gate electrodes. Then, using both first and second levels of polysilicon and further using a metal contact in combination with ion implantation, first, second, and third bipolar transistors are formed in adjacent regions of the epitaxial layer and in separate P-type or N-type wells therein. The emitter of the first bipolar transistor is formed by out-diffusion of impurities from a first level of polysilicon, whereas the emitter of the second bipolar transistor is formed by out-diffusion of impurities from the second level of polysilicon. The third bipolar transistor is formed by first implanting ions to form the emitter region within the previously formed base region of the transistor, and ohmic contact is made to the emitter via a metal connection. Each of the above three (3) bipolar transistors has a different current gain and a different breakdown voltage and thus affords the integrated circuit designer with a high degree of circuit design flexibility when making interconnections in the BiCMOS integrated circuitry thus formed.

The above brief summary of the invention, together with its stated objects, various related advantages and novel features, will become more readily apparent with reference to the following description of the accompanying drawings.

BRIEF DESCRIPTION OF THE DRAWINGS

FIG. 1 is a schematic cross section view illustrating an intermediate device structure and related process for forming N-type and P-type buried layers (NBL and PBL) in a P-type substrate; the formation of N-type wells and P-type wells in an epitaxial layer on top of these buried layers using complementary metal-oxide-silicon (CMOS) wafer processing, the formation of the field oxide regions on the surface of the epitaxial layer; and the formation of the three base regions for the three types of bipolar transistors to be formed respectively in three of the N-type wells previously defined.

FIG. 2 is a schematic cross sectional diagram which illustrates the formation of an N-channel CMOS transistor in an P-type well and also the formation of two (left side and right side) of the three bipolar transistor emitters for two of the different types of bipolar transistors respectively shown to the right of the MOS transistor.

FIG. 3 is a schematic cross sectional diagram illustrating the formation of a third bipolar transistor emitter and the central transistor of the three bipolar transistors shown. FIG. 3 also illustrates the formation of a P-channel CMOS transistor in an N-type well, and the formation of the $P^+$ ohmic contact regions for the bases of the three bipolar transistors.

FIG. 4 is a schematic cross sectional view illustrating the formation of a thick borophososilicate glass (BPSG) layer in the final process phase for the structure and the opening of vias therein in which electrical contacts are formed to make electrical connections to the P-type and N-type source and drain regions of the MOS transistors and to the collector, base, and emitter regions for the bipolar transistors. However, as will be explained in more detail below, the emitters of the first two bipolar transistors viewed from left to right in FIG. 4 are formed, respectively, by out-diffusion from the polysilicon line No. 1 (poly 1) and the subsequently formed polysilicon line No. 2 (poly 2).

DETAILED DESCRIPTION OF THE PREFERRED EMBODIMENT

In the following detailed description of the preferred embodiment, references made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical, physical, architectural, and electrical changes may be made without departing from the spirit and scope of the present invention. The following detailed description is, therefore, not to be taken in a limiting sense, and the scope of the present invention is defined only by the appended claims and their equivalents.

Figure 1:
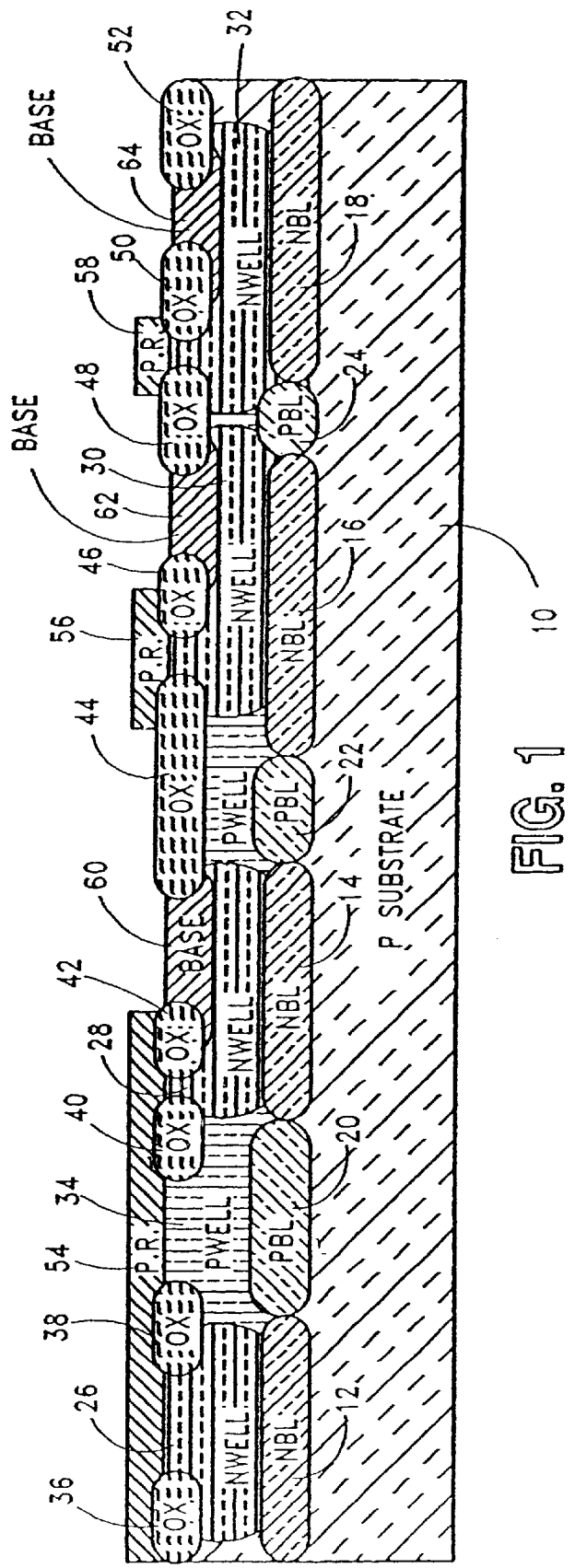
FIGS. 1 through 4 are a series of abbreviated schematic cross sectional views showing a sequence of process steps used in a preferred embodiment of the invention.
Figure 2:
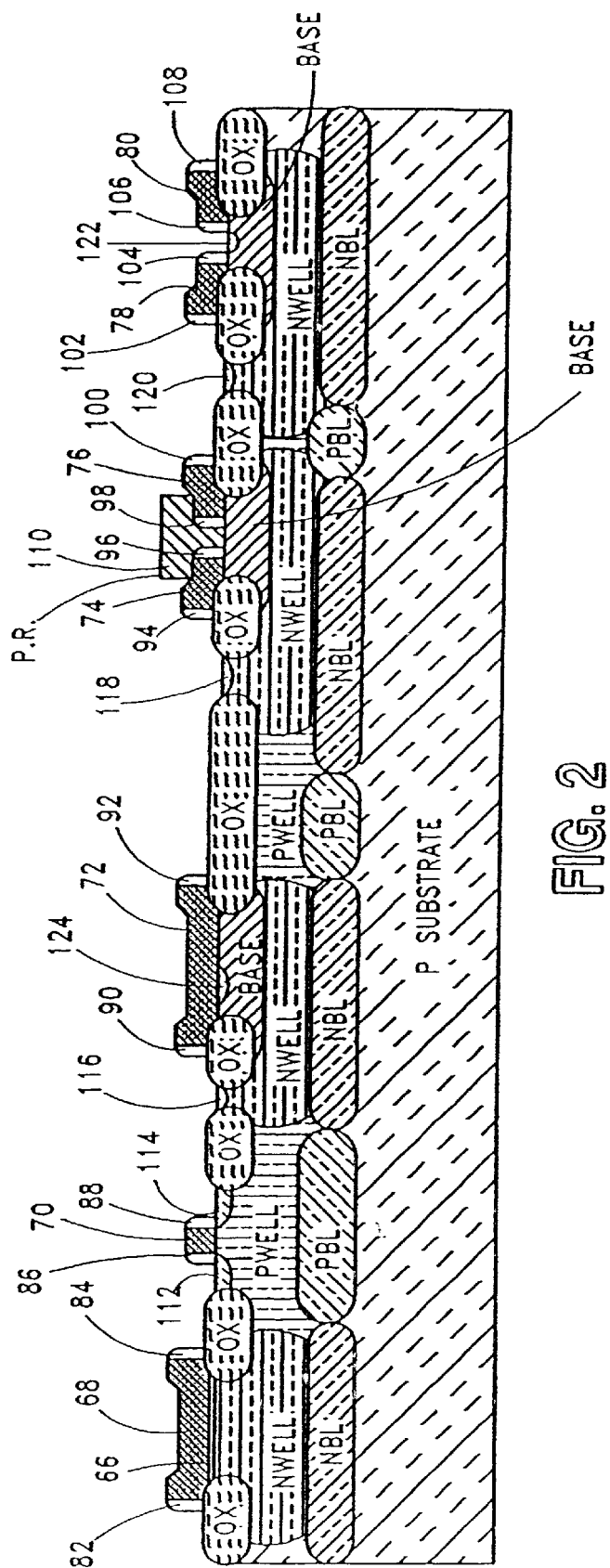
Figure 3:
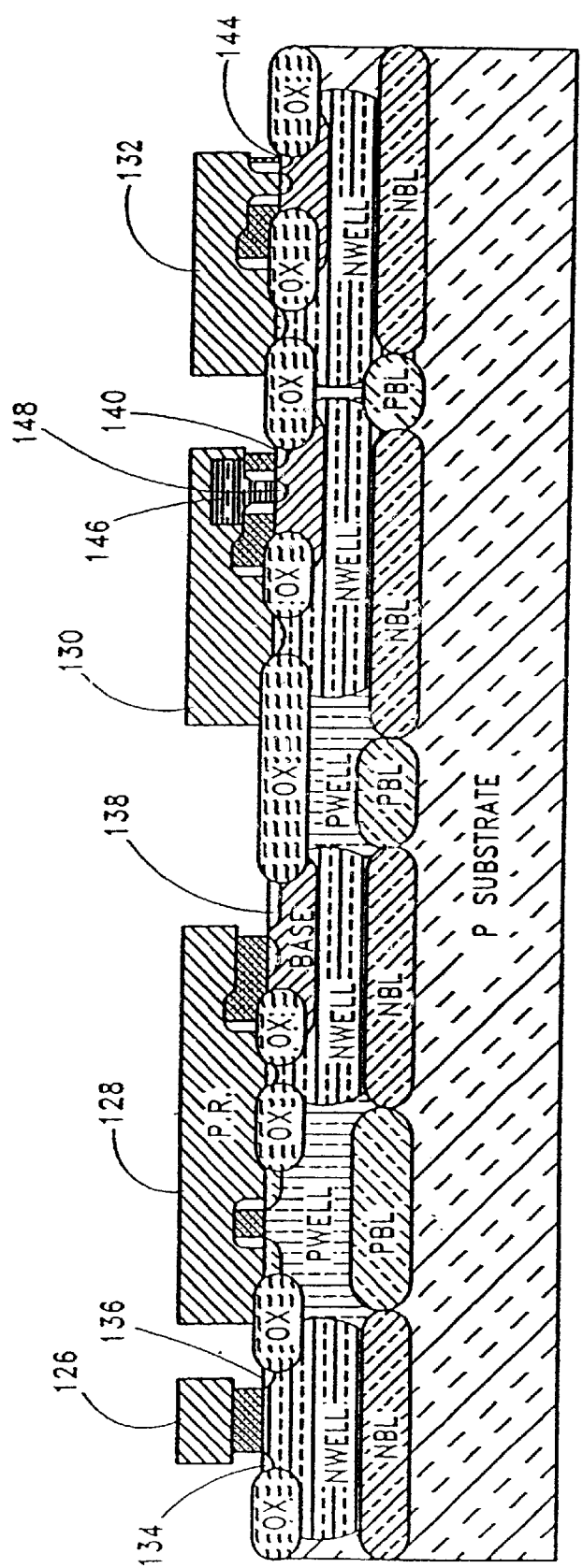

Referring now to FIG. 1, the present wafer processing sequence starts with a P-type substrate 10 into which a plurality of N-type buried layers (NBL) 12, 14, 16, and 18 are formed by either diffusion or ion implantation doping and separated from the subsequently formed alternate P-type buried layers (PBL) 20, 22, and 24. As is well known in the art, the P-type and N-type heavily doped buried layers serve to reduce the resistance, e.g. bipolar transistor collector resistance, in the transistors which are subsequently formed above these buried layers. Inasmuch as the intermediate structures shown in each of the FIGS. 1, 2, and 3 have been constructed using a large number of individual process steps which would correspond to a correspondingly large number of individual cross sectional views, the intermediate structures shown in FIGS. 1, 2, and 3 are used to represent these large numbers of process steps. However, the chemistries of these individual process steps will be described in substantial detail herein in order to clearly teach those skilled in the art the state-of-the-art MOS and bipolar processing which can be used in constructing a preferred embodiment of the invention.

In order to form the N-buried layers and the P-buried layers identified above, the initial P-type substrate starting material is first provided with a thin 200 angstrom layer of silicon dioxide, $SiO_2$ followed by the deposition of a thicker 700 angstrom layer of silicon nitride, $Si_3N_4$. Then, a photoresist mask is used to photolithographically define an opening over the NBL regions 12, 14, 16, and 18, whereafter a nitride etchant is used to remove the silicon nitride over the NBL regions to be formed. Then, an arsenic ion implantation step is used to implant arsenic ions through these openings and through the thin 200 angstrom layer of $SiO_2$ to form the 2 NBL layers 12, 14, 16, and 18 as shown.

In the next step of the process, the photoresist mask is removed and then the entire oxidized surface remaining is then further oxidized to a thickness of about 3000 angstroms, while driving in the arsenic ion implantation further into the NBL regions 12, 14, 16, and 18. However, in this additional oxidation step, no further oxidation will grow under the nitride regions remaining over the PBL regions 20, 22, and 24 to be formed. Therefore, in the next step of the process when the nitride is stripped off of the surfaces of the to-be-formed PBL regions 20, 22, and 24, this leaves two different oxide thicknesses, i.e., the remaining thick oxide over the NBL regions 12, 14, 16, and 18 and a thin oxide layer of 200 angstroms over the to-be-formed PBL regions 20, 22, and 24. This differential thickness mask in turn allows boron ions to be implanted through the thin oxide regions and thus form the PBL regions 20, 22 and 24. This boron implantation step thus penetrates the thin oxide over the PBL regions 20, 22, and 24 to form these P-type buried layers in the geometry shown. Since the arsenic dopant used to form the NBL regions is a slower diffusant than the boron dopant used to form the PBL regions, the PBL regions will out-diffuse to a greater height as shown in FIG. 1 as will be appreciated by those skilled in the art.

After the above wafer processing has been completed to form the NBL and PBL regions, all oxide is removed from the upper surfaces of the NBL and PBL regions, and the P-type substrate 10 is then transferred to a conventional epitaxial reactor wherein a continuous uniform epitaxial layer is formed across the entire upper surface of the NBL and PBL regions. Then, using conventional state-of-the-art CMOS processing technology, the N-type wells 26, 28, 30, and 32 and the P-type wells 34 are formed in the geometry shown. These N-type and P-type may be formed using the processes described in the above identified U.S. Pat. No. 4,987,089 issued to Ceredig Roberts.

In the next step of the process, the surface of the epitaxial layer of the silicon wafer 10 is appropriately masked and then exposed to another oxide deposition step wherein the field oxide regions 36, 38, 40, 42, 44, 46, 48, 50, and 52 are formed in the geometry shown. Then, a photoresist mask consisting a left side photoresist section 54 and intermediate and right side photoresist sections 56 and 58 are formed in the geometry shown in preparation for a boron ion implantation step used in the formation of the base regions 60, 62, and 64 of the three side-by-side bipolar transistors. The photoresist mask 54, 56, and 58 is then etched away from the upper surface of the structure shown in FIG. 1, and this structure is now ready for further processing in accordance with the desired geometry of the first level of polysilicon (poly 1) to be formed as shown in FIG. 2.

In the first step of the FIG. 2 processing, a thin gate oxide layer 66 is grown to a thickness of approximately 200 angstroms across the entire upper surface of the previously formed epitaxial layer, and then a first layer of polysilicon (poly 1) is formed initially over the entire surface of the structure shown in FIG. 2. The poly 1 layer is doped with an N-type dopant either in situ (i.e., during deposition) or subsequent to deposition by one of any number of techniques that are well known in the art. Then, using conventional photolithographic masking and etching techniques, the poly 1 layer is etched in the geometry shown in FIG. 2, thereby leaving (from left to right) the remaining regions or islands of poly 1 and identified as regions 68, 70, 72, 74, 76, 78, and 80. In addition, at the edges of each of these remaining regions of poly 1 are formed in the contoured geometry shown the oxide spacer regions 82, 84, 86, 88, 90, 92, 94, 96, 98, 100, 102, 104, 106, and 108 using spacer oxide formation processes which are well known in the art. For a further discussion of how these spacer oxide regions are formed, reference may be made to a book entitled *Silicon Processing for the VLSI Era*, Vol II by S. Wolf, pp 356–360, incorporated herein by reference.

In the next step of the process, the thin surface oxide not protected by the remaining poly 1 or oxide spacer regions is removed from the surface of the structure shown in FIG. 2 using either an oxide plasma etch or wet etch using $H_2SO_4$. Thereafter, a significant and critical photoresist mask 110 is formed in the geometry shown over the base region of the intermediate bipolar transistor. This photoresist mask region 110 will subsequently define the geometry of the poly 2 level contact to the emitter region to be formed within the base region of the intermediate bipolar transistor.

The structure shown in FIG. 2 is now ready for an $N^+$ ion implantation step used to form the $N^+$ source and drain regions 112 and 114 of the left side N-channel MOS transistor and the $N^+$ collector contact regions 116, 118, and 120 for the three bipolar transistors. This is accomplished using an arsenic ion implantation step to thus complete these source and drain and collector contact regions as previously defined. Simultaneously, the $N^+$ emitter region 122 in the far right side bipolar transistor is formed by this arsenic implantation step, and quite significantly, it should be noted here that neither the emitter for the first and second bipolar transistors (from left to right) are formed by this ion implantation step. That is to say, the emitter region 124 of the first bipolar transistor has been previously formed by the out-diffusion of impurities from poly 1 region 72 constructed in the geometry defined with its buried contact region extending through the thin gate oxide layer. This buried contact region is used to form, by out-diffusion, the emitter region 124 of the first bipolar transistor. However, at the FIG. 2 process stage, the to-be-formed emitter region in the central or second bipolar transistor is still protected by the photoresist mask 110 previously described.

Referring now to FIG. 3, the structure shown in this figure is now completed for the CMOS N-channel transistors and is now ready for the formation of the P-channel transistors in the N-wells, the formation of the bipolar transistor base contacts or ohmic contact regions and also the formation, by out-diffusion from poly level 2, of the emitter region of the second or central bipolar transistor. This is all accomplished by first depositing a level 2 layer of polysilicon (poly 2) over the entire surface of FIG. 2 after the photoresist mask 110 has been removed, doping the poly 2 layer with an N-type dopant, and then masking and etch removing all of poly 2 except for the T-shaped plug 146 which defines, by out-diffusion of N-type impurities, the emitter region 148 of the central bipolar transistor. Then a photoresist mask is formed and consists of P. R. mask sections 126, 128, 130, and 132 having the openings therein as shown to enable a boron implantation step to be performed in order to form the source and drain regions 134 and 136 of the P-channel CMOS transistor and also to form the base ohmic contact regions 138, 140, and 142 for the three bipolar transistors.

Figure 4:
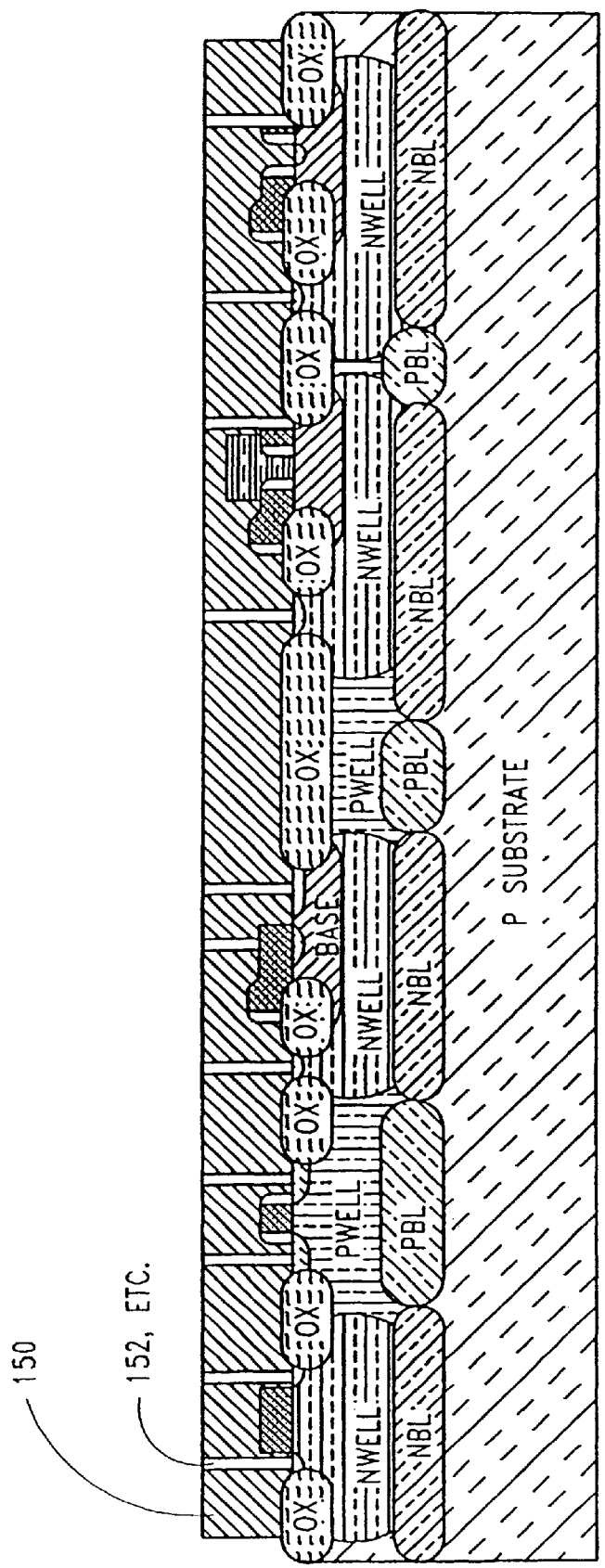

Referring now to FIG. 4, this figure illustrates the final stages of the integrated circuit device processing wherein a thick layer of borophososilicate glass (BPSG) 150 is formed on the upper surface of the IC structure and then processed in a conventional fashion to form a plurality of vertical vias or interconnect openings 152. These openings 152 are used to receive metal conductors such as tungsten, W, which in turn make ohmic contacts to the source and drain regions of the CMOS transistors and also to all of the collector and base contacts of the three bipolar transistors, and further to make electrical contact to the emitter of the third or far right bipolar transistor as shown. Thus, the third or far right bipolar transistor has a metal contacted emitter, whereas the second or poly 2 bipolar transistor has an emitter region which has been formed by out-diffusion from poly 2 and the emitter region of the first bipolar transistor is formed by out-diffusion from poly 1 as previously described.

Thus, in addition to offering state of the art CMOS technology for forming P-channel and N-channel CMOS transistors, the present process further provides for the construction of three different types of bipolar transistors which can be constructed to have, respectively, from left to right as shown in FIG. 4, a high gain and low breakdown voltage, a lower gain and a higher breakdown voltage, and an intermediate gain and intermediate breakdown voltage for the metal contacted emitter. As is well known in the art, both the gain and breakdown voltage are related to the depth to which the emitter is diffused into the base region of a planar transistor. The smaller the base width between emitter-base junction and base-collector junction, the higher the transistor current gain and the lower the transistor breakdown voltage. The poly 1 emitter will be formed to the greatest depth within the base region of the first bipolar transistor, whereas the poly 2 emitter will be formed to the most shallow depth into the base region to thereby form the bipolar transistor with the highest breakdown voltage, but lowest gain. Intermediate these high and low gains and low and high breakdown voltages respectively is the third or far right bipolar transistor shown in FIG. 4 having the metal contacted emitter.

Various modifications may be made in and to the above described embodiments without departing from the spirit and scope of this invention. Accordingly, many device and process modifications available to those skilled in the art and useful in manufacturing a wide variety of integrated circuits other than static random access memories (SRAMs) are clearly within the scope of the following appended claims.

We claim:

1. A process for fabricating an integrated circuit, comprising:
    forming N-type and P-type buried layers in a silicon substrate;
    forming an epitaxial layer above the N-type and P-type buried layers;
    forming a plurality of wells in the epitaxial layer;
    forming at least two MOS transistors in the wells in the epitaxial layer, wherein gates of the MOS transistors are formed of a first level of polysilicon;
    forming a first bipolar transistor in another well of the epitaxial layer, wherein an emitter of the first bipolar transistor is formed by outdiffusing impurities from the first layer of polysilicon;
    forming a second bipolar transistor in yet another well of the epitaxial layer, wherein an emitter of the second bipolar transistor is formed by outdiffusing impurities from the second layer of polysilicon; and
    forming a third bipolar transistor in still another well of the epitaxial layer, wherein an emitter of the third bipolar transistor is formed by ion implantation into the epitaxial layer.

2. The process according to claim 1, wherein the steps are performed in the recited order.

3. The process of claim 1, wherein forming the first bipolar transistor includes forming the emitter of the first bipolar transistor in contact with the first layer of polysilicon.

4. The process of claim 1, wherein forming the second bipolar transistor includes forming the emitter of the second bipolar transistor in contact with the second layer of polysilicon.

5. The process of claim 1, wherein forming a plurality of wells includes forming an N-type well and a P-type well.

6. A process for fabricating an integrated circuit, comprising:
    forming N-type and P-type buried layers in a silicon substrate;
    forming an epitaxial layer above the N-type and P-type buried layers;
    forming a plurality of wells in the epitaxial layer;
    forming a first polysilicon layer over the epitaxial layer;
    forming at least two MOS transistors in at least two of the wells in the epitaxial layer;
    forming a first bipolar transistor in another well of the epitaxial layer, wherein forming the first bipolar transistor includes outdiffusing impurities from the first polysilicon layer to form an emitter of the first bipolar transistor;
    forming a second polysilicon layer;
    forming a second bipolar transistor in yet another well of the epitaxial layer, wherein forming the second bipolar transistor includes outdiffusing impurities from the second polysilicon layer to form an emitter of the second bipolar transistor; and
    forming a third bipolar transistor in still another well of the epitaxial layer.

7. The process of claim 6, wherein forming the third bipolar transistor includes implanting an emitter of the third bipolar transistor into the epitaxial layer.

8. The process of claim 6, wherein forming the second polysilicon layer includes doping the second polysilicon layer with an N-type dopant.

9. The process of claim 8, wherein forming the second bipolar transistor includes masking and selectively etching the second polysilicon layer except for a portion thereof over a base of the second bipolar transistor.

10. The process of claim 9, wherein outdiffusing impurities from the second polysilicon layer to form the emitter of the second bipolar transistor includes outdiffusing N-type dopant from the portion of the second polysilicon layer into the base to form the emitter.

11. A process for fabricating an integrated circuit, comprising:
    forming N-type and P-type buried layers in a silicon substrate;
    forming an epitaxial layer above the N-type and P-type buried layers;
    forming a plurality of wells in the epitaxial layer;
    forming at least two MOS transistors in the wells in the epitaxial layer, wherein gates of the MOS transistors are formed of a first level of polysilicon;
    forming a high-gain bipolar transistor in another well of the epitaxial layer, wherein an emitter of the high-gain bipolar transistor is formed by outdiffusing impurities from the first layer of polysilicon;
    forming a low-gain bipolar transistor in yet another well of the epitaxial layer, wherein an emitter of the low-gain bipolar transistor is formed by outdiffusing impurities from the second layer of polysilicon; and
    forming an intermediate-gain bipolar transistor in still another well of the epitaxial layer, wherein an emitter of the intermediate-gain bipolar transistor is formed by ion implantation into the epitaxial layer.

12. The process of claim 11, wherein forming the high-gain bipolar transistor includes forming the emitter of the high-gain bipolar transistor in contact with the first layer of polysilicon.

13. The process of claim 11, wherein forming the low-gain bipolar transistor includes forming the emitter of the low-gain bipolar transistor in contact with the second layer of polysilicon.

14. The process of claim 11, wherein forming a plurality of wells includes forming an N-type well and a P-type well.

15. The process of claim 11, wherein outdiffusing impurities from the first layer of polysilicon includes outdiffusing impurities to a first depth, and outdiffusing impurities from the second layer of polysilicon includes outdiffusing impurities to a second depth less than the first depth.

16. The process of claim 11, wherein forming the intermediate-gain bipolar transistor includes contacting a metal to the emitter of the intermediate-gain bipolar transistor.

17. A process for fabricating an integrated circuit, comprising:
    forming N-type and P-type buried layers in a silicon substrate;
    forming an epitaxial layer above the N-type and P-type buried layers;
    forming a plurality of wells in the epitaxial layer;
    forming a first layer of polysilicon;
    forming at least two MOS transistors in the wells in the epitaxial layer, wherein forming the at least two MOS transistors includes forming gates of the at least two MOS transistors from the first level of polysilicon and forming implanting ions to form the source and drain regions of at least one of the MOS transistors;
    forming a first bipolar transistor in another well of the epitaxial layer, wherein forming the first bipolar transistor includes outdiffusing impurities from the first layer of polysilicon to form an emitter;
    forming a second layer of polysilicon;
    forming a second bipolar transistor in yet another well of the epitaxial layer, wherein forming a second bipolar transistor includes outdiffusing impurities from the second layer of polysilicon to form an emitter; and
    forming a third bipolar transistor in still another well of the epitaxial layer, wherein forming the third bipolar transistor includes simultaneously forming an emitter of the third bipolar transistor with the source and drain regions of the at least one MOS transistor.

18. The process of claim 17, wherein simultaneously forming an emitter of the third bipolar transistor includes implanting the same ions that form the source and drain regions of the at least one MOS transistor.

19. The process of claim 18, wherein forming the second layer of polysilicon includes depositing a polysilicon level over the entire surface, doping the polysilicon level, and masking and etching the polysilicon level to form a plug of doped polysilicon level over a base of the second bipolar transistor.

20. The process of claim 19, wherein outdiffusing impurities includes outdiffusing dopant only from the plug.

21. A process for fabricating an integrated circuit, comprising:
    forming N-type and P-type buried layers in a silicon substrate, wherein forming the N-type buried layers include performing at least one of ion implantation or diffusion;
    forming an epitaxial layer above the N-type and P-type buried layers;
    forming a plurality of wells in the epitaxial layer;
    forming a first layer of polysilicon;
    forming at least two MOS transistors in the wells in the epitaxial layer, wherein forming the at least two MOS transistors includes forming gates of the at least two MOS transistors from the first level of polysilicon and forming implanting ions to form the source and drain regions of at least one of the MOS transistors;
    forming a first bipolar transistor in another well of the epitaxial layer, wherein forming the first bipolar transistor includes outdiffusing impurities from the first layer of polysilicon to form an emitter;
    forming a second layer of polysilicon;
    forming a second bipolar transistor in yet another well of the epitaxial layer, wherein forming a second bipolar transistor includes outdiffusing impurities from the second layer of polysilicon to form an emitter; and
    forming a third bipolar transistor in still another well of the epitaxial layer, wherein forming the third bipolar transistor includes simultaneously forming an emitter of the third bipolar transistor with the source and drain regions of the at least one MOS transistor.

22. The process of claim 21, wherein forming the N-type buried layers include:
    forming a thin silicon dioxide layer on a P-type substrate;
    depositing a thicker silicon nitride layer on the silicon dioxide layer;
    removing silicon nitride over the N-type buried layers to form implant apertures; and
    implanting N-type dopants through the implant apertures.

23. The process of claim 22, wherein forming the N-type buried layers include oxidizing the surface to drive the N-type dopants further into the substrate.

24. The process of claim 23, wherein forming the P-type buried layers include stripping off the silicon nitride, and implanting P-type dopants into P-type buried regions.

25. The process of claim 22, wherein forming the P-type buried layers include stripping off the silicon nitride, and implanting P-type dopants into P-type buried regions.

26. A process for fabricating an integrated circuit, comprising:
    forming N-type and P-type buried layers in a silicon substrate;
    forming an epitaxial layer above the N-type and P-type buried layers;
    forming a plurality of wells in the epitaxial layer;
    forming a MOS transistor in one of the wells in the epitaxial layer, wherein forming the MOS transistor includes forming a source and a drain;
    forming a first bipolar transistor in a first of the wells of the epitaxial layer;
    forming a second bipolar transistor in a second of the wells of the epitaxial layer;
    forming a third bipolar transistor in a third of the wells of the epitaxial layer, wherein forming the third bipolar transistor includes forming an emitter; and
    wherein forming the source and drain of the MOS transistor and forming the emitter of the third bipolar transistor are simultaneously formed by ion implantation into the epitaxial layer.

27. The process of claim 26, wherein forming the second bipolar transistor includes forming a second layer of polysilicon and outdiffusing impurities from the second layer of polysilicon to form an emitter.

28. The process of claim 27, wherein forming the second bipolar transistor includes forming the emitter of the second bipolar transistor in contact with the second layer of polysilicon.

29. The process of claim 26, wherein forming a plurality of wells includes forming an N-type well and a P-type well.

30. The process of claim 26, wherein forming the MOS transistor includes forming a gate from a first level of polysilicon.

31. The process of claim 26, wherein forming the first bipolar transistor includes outdiffusing impurities from the first layer of polysilicon to form an emitter.

32. The process of claim 31, wherein forming the first bipolar transistor includes forming the emitter of the first bipolar transistor in contact with the first layer of polysilicon.

* * * * *